United States Patent [19]
Schofield

[11] Patent Number: 5,932,485
[45] Date of Patent: Aug. 3, 1999

[54] METHOD OF LASER ABLATION OF SEMICONDUCTOR STRUCTURES

[75] Inventor: Kevin H. Schofield, Boise, Id.

[73] Assignee: Micron Technology, Inc., Boise, Id.

[21] Appl. No.: 08/955,220

[22] Filed: Oct. 21, 1997

[51] Int. Cl.$^6$ .................................................. H01L 21/00
[52] U.S. Cl. ........................ 438/690; 438/707; 438/742
[58] Field of Search .................................. 438/690, 707, 438/742; 216/56

[56] References Cited

U.S. PATENT DOCUMENTS

| | | | |
|---|---|---|---|
| 4,880,684 | 11/1989 | Boss et al. ............................... | 428/209 |
| 5,086,018 | 2/1992 | Conru ..................................... | 437/207 |
| 5,169,678 | 12/1992 | Cole et al. ............................... | 427/555 |
| 5,236,551 | 8/1993 | Pan ......................................... | 156/643 |
| 5,258,236 | 11/1993 | Arjavalingam et al. ................ | 428/626 |
| 5,272,671 | 12/1993 | Kudo et al. .............................. | 365/200 |
| 5,350,705 | 9/1994 | Brassington et al. ................... | 257/295 |
| 5,382,678 | 1/1995 | Yu et al. .................................. | 437/190 |
| 5,427,983 | 6/1995 | Ahmad et al. ........................... | 437/192 |
| 5,505,320 | 4/1996 | Burns et al. ............................. | 216/13 |
| 5,550,373 | 8/1996 | Cole et al. ............................... | 250/338.1 |
| 5,572,066 | 11/1996 | Safai ....................................... | 257/666 |
| 5,612,254 | 3/1997 | Mu et al. ................................. | 437/195 |
| 5,616,524 | 4/1997 | Wei et al. ................................. | 438/4 |

OTHER PUBLICATIONS

Patel, R. S. et al, Laster Via Ablation Technology for MCM–D Fabrication at IBM Microelectronics, The International Journal of Microcircuits and Electronic Packaging, vol. 18, No. 3, Third Quarter 1995.

Endert, H., et al, Excimer Lasers in Manufacturing, SPOE Photonics West '97, Feb. 8–14, 1997, San Jose, California.

Industrial Report No. 10, Lambda Physik, May 1996.

*Primary Examiner*—Bruce Breneman
*Assistant Examiner*—Alva C Powell
*Attorney, Agent, or Firm*—Workman, Nydegger & Seeley

[57] ABSTRACT

Disclosed is a process for exposing a metal-containing surface feature on an integrated circuit wafer by laser ablation. According to the invention, a silicon dioxide passivation layer is provided upon the surface feature. The silicon dioxide layer is transparent to electromagnetic radiation having a specified wavelength, such that the electromagnetic radiation is directed through the silicon dioxide layer onto the underlying surface feature. A portion of the surface feature is ablated. Ablation of the surface feature causes removal of an overlying portion of the silicon dioxide layer, thereby exposing the surface feature. Laser ablation may further be performed on optional overlying layers of silicon nitride and polyimide.

42 Claims, 5 Drawing Sheets

METHOD OF LASER ABLATION OF SEMICONDUCTOR STRUCTURES

BACKGROUND OF THE INVENTION

1. The Field of the Invention

The present invention relates to methods of laser ablating material from semiconductor structures. More particularly, the present invention relates to a method of using a laser for ablating material from a multilayer semiconductor structure to expose a surface of an underlying metal-containing layer.

2. The Relevant Technology

Integrated circuits are currently manufactured by an elaborate process in which semiconductor devices, insulating films, and patterned conducting films are sequentially constructed in a predetermined arrangement on a semiconductor substrate. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above.

After a completed integrated circuit is formed on a semiconductor substrate, packaging and other related steps follow to produce individual chips in a form for convenient use by consumers. Packaging steps are conducted to provide electrical interconnection between an integrated circuit and the external environment, to establish signal and power distribution to the integrated circuit, to dissipate heat from the chip, and to physically protect the chip. Various packaging steps include passivation of metallized surfaces, application of a stress buffer, re-exposure of bond pads and fuse lines on the semiconductor substrate, formation of individual chips, positioning chips in lead frames, establishing electrical connection between the integrated circuit and external leads, and application of molding compound. Each packaging step adds some cost to the manufacturing process.

One common packaging-related step is passivation of metal-containing surface layers on an integrated circuit wafer, as illustrated in FIG. 1A of the drawings. Passivation involves forming protective layers upon exposed surfaces that might otherwise be subject to oxidation, such as those of metallized electrical conductors. In particular, it is common practice to form successive passivation layers of silicon dioxide 12 and silicon nitride 14 upon surface features 16 of an integrated circuit wafer such as bond pads and fuse lines. Fuse lines provide an access means by which faulty circuitry within an integrated circuit may be disabled. Bond pads provide an electrical interface between the internal circuitry of a chip circuit and the external environment. Bond pads typically include an electrical conductor such an aluminum/copper alloy overlaid by a diffusion barrier that prevents diffusion of material between the electrical conductor and adjacent material. Titanium nitride is known as a suitable diffusion barrier material.

Another conventional packaging step involves encapsulating an individual chip in a molding compound that protects the chip from shock and environmental conditions and dissipates heat generated by the chips. However, molding compound is usually more rigid than the chips on which it is formed. Additionally, molding compound and chips generally have different coefficients of thermal expansion. As a result of these differences in mechanical properties, stress builds up in the encapsulated chip, potentially shearing wiring and cracking inorganic passivation layers. It is understood that the use of a stress buffer positioned between a chip and molding compound substantially reduces the problem of mechanical failure. A common material for use as a stress buffer is a polyimide material having a lower modulus of elasticity than that of either the chip or the molding compound. Polyimide reduces stress in the chip by absorbing much of the stress and deformation caused by application of encapsulating molding compound. It likewise protects both the chip and the molding compound from damage due to thermal expansion or other mechanical deformation of the materials.

As layers of silicon dioxide, silicon nitride, polyimide and the like are formed upon an integrated circuit wafer, bond pads and fuse lines and other surface features must be re-exposed during or after the chip packaging process. When conventional chip packaging—including passivation and formation of a polyimide stress buffer—is used, one or two costly photolithographic steps (photo steps) are needed, as shown in FIGS. 1A and 1B. In the prior art, a first photo step is conducted on passivation layer 18 before stress buffer 22 is formed. First photoresist layer 24 is deposited and patterned over passivation layer 18. Surface feature 16 of the integrated circuit is exposed by etching or otherwise selectively removing material from region 26 (shown in phantom) of passivation layer 18 through the pattern 28 of first photoresist layer 24. First photoresist layer 24 is then stripped from passivation layer 18. At this point, polyimide stress buffer 22 is formed upon patterned passivation layer 18, extending into opening 29 formed during the first photo step. Polyimide stress buffer 22 consists of photosensitive polyimide or, alternatively, an amic acid polyimide. If the amic acid polyimide is used, another photo step is needed to re-expose surface features in which second photoresist layer 30 is deposited and patterned. An etch is used to selectively remove polyimide material from region 32 (shown in phantom) through pattered second photoresist layer 30, after which second photoresist layer 30 is stripped.

The above-described process adequately protects the underlying chip but requires costly photo steps. Methods have been developed for removing material from a polyimide layer and an underlying passivation layer using laser ablation in place of one of the photo steps as seen in FIGS. 2A and 2B. Such a method is disclosed in U.S. Pat. No. 5,616,524 issued to Wei et al. According to methods of Wei et al., radiation from a laser having a wavelength that is readily absorbed by polyimide material and by silicon nitride is directed onto a multilayer structure. Material is ablated from region 34 (shown in phantom) that comprises portions of photoresist layer 24, stress buffer 22, and silicon nitride layer 14. Further according to Wei et al., laser ablation of silicon nitride layer 14 exposes an underlying silicon dioxide layer 12 positioned upon surface feature 16 that is to be exposed. However, the radiation is not readily absorbed by the silicon dioxide layer 12. As a result, Wei et al. teaches use of a photo step for removing material from region 36 of silicon dioxide layer 12 to expose surface feature 16. Prior art laser ablation methods such as that taught by Wei et al. reduce, but do not eliminate, the need for photo steps.

Part of packaging individual chips involves providing secure electrical connection between bond pads and external leads. Typically, a patterned metal lead frame is positioned near the semiconductor chip. Often, an interleaving layer of adhesive, dielectric lead-on-chip tape is used to attach the lead frame to the top of the semiconductor. In applications that use a polyimide stress buffer, the lead-on-chip tape is positioned between the polyimide stress buffer layer and the lead frame. Electrical connection is established between a bond pad and a corresponding lead on the lead frame by means of electrically conductive wiring. Application of lead-on-chip tape involves at least one additional packaging step and contributes to the overall cost of manufacturing. In addition, lead-on-chip tape sometimes does not fully conform to the surface of the polyimide layer and traps small pockets of air against the polyimide surface. Moisture in the entrapped air can cause deterioration of the chip.

As will be appreciated, it would be advantageous to provide a method for exposing surface features of an integrated circuit chip through layers of polyimide, silicon nitride and silicon dioxide using laser ablation without using photolithographic steps. A method for providing adequate stress buffering in connection with a laser ablation process is also needed. Furthermore, a method for attaching a lead frame to an integrated circuit chip without using lead-on-chip tape would be advantageous.

SUMMARY OF THE INVENTION

The present invention relates to a method of exposing a surface on an integrated circuit wafer that involves laser ablation of overlying layers. According to the invention, an integrated circuit is provided having a metal-containing surface feature. A silicon dioxide passivation layer and a silicon nitride passivation layer are provided upon the surface feature and the adjacent integrated circuit surface. A stress buffer containing polyimide is formed upon the silicon nitride passivation layer. Electromagnetic radiation emitted from a laser ablates material successively from the polyimide stress buffer and the silicon nitride passivation layer, thereby exposing an underlying silicon dioxide passivation layer. The silicon dioxide layer is substantially transparent to the radiation emitted from the laser. Consequently, the radiation passes through the silicon dioxide layer and is absorbed by the underlying metal-containing surface feature. Material is ablated from a region of the underlying metal-containing surface feature, which in turn removes material from an overlying region of the silicon dioxide layer. As a result, a surface on the metal-containing surface feature is exposed. The method provides access to various surface features of a semiconductor chip during or after packaging processes. Such surface features include bond pads, fuse lines, and scribe streets. Bond pads processed according to the invention have an exposed surface sufficiently planarized and smooth to adequately bond with external wiring.

The method of the invention provides the advantage of exposing a surface on a semiconductor chip while eliminating photo steps. Accordingly, the costly steps of depositing photoresist material, patterning the photoresist material, etching the underlying layers, and stripping the photoresist material are avoided. According to the invention, the polyimide stress buffer has a thickness sufficient to shield the integrated circuit from alpha particle radiation. Using polyimide as an alpha particle barrier eliminates the use of relatively expensive high end molding compound that is conventionally used to absorb alpha particles. The method allows semiconductor chips to function in environments wherein radiation might otherwise reduce reliability, damage memory, or otherwise cause failure. Additionally, the method of this invention provides an option of attaching a lead frame directly upon the polyimide stress buffer. Thus, the need for using lead-on-chip tape is avoided and the cost of post manufacturing packaging processes is reduced. The polyimide conforms to the lead frame such that air pockets trapped against the polyimide are substantially eliminated.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are therefore not to be considered limiting of its scope, the invention will be described with additional specificity and detail through the use of the accompanying drawings in which.

DETAILED DESCRIPTION OF THE PREFERRED EMBODIMENTS

Figure 1A:
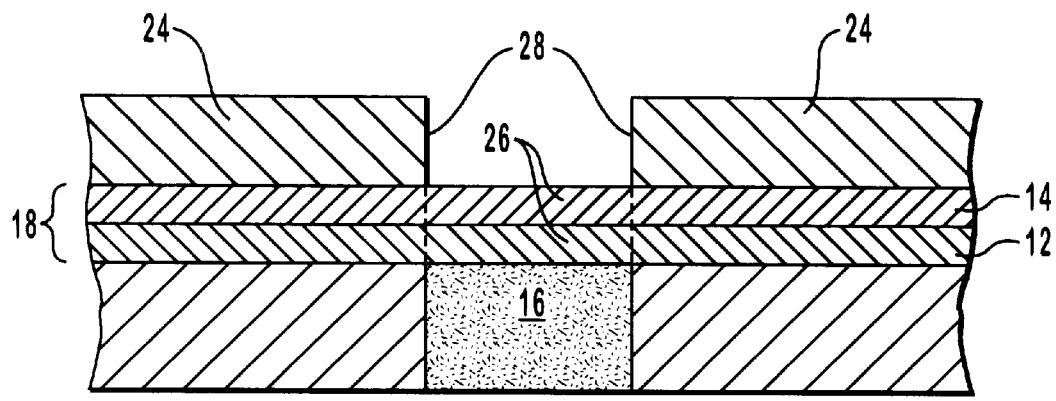
FIGS. 1A and 1B are cross-section elevation views of a multilayer structure subjected to a method for exposing a surface of a metal-containing layer involving the use of two photolithographic steps as known in the prior art
Figure 1B:
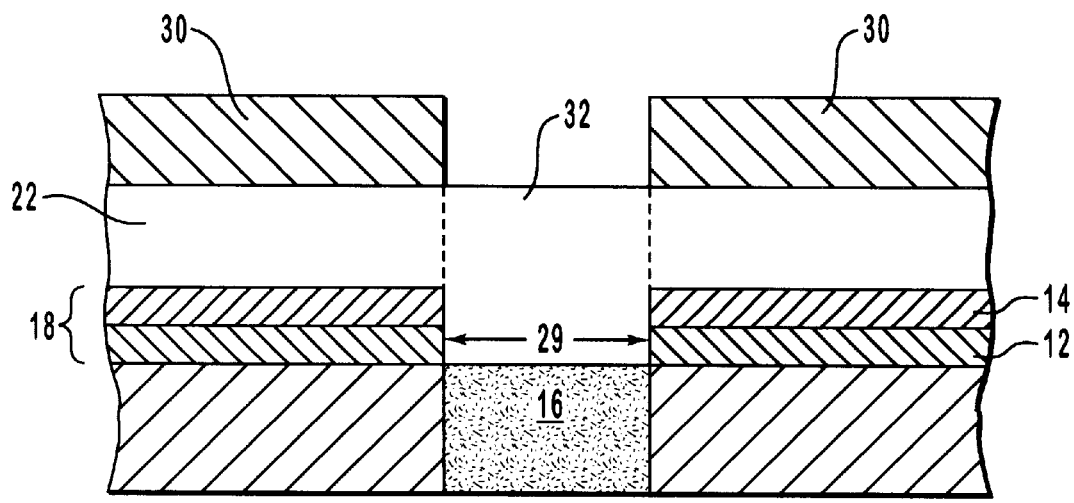
Figure 2A:
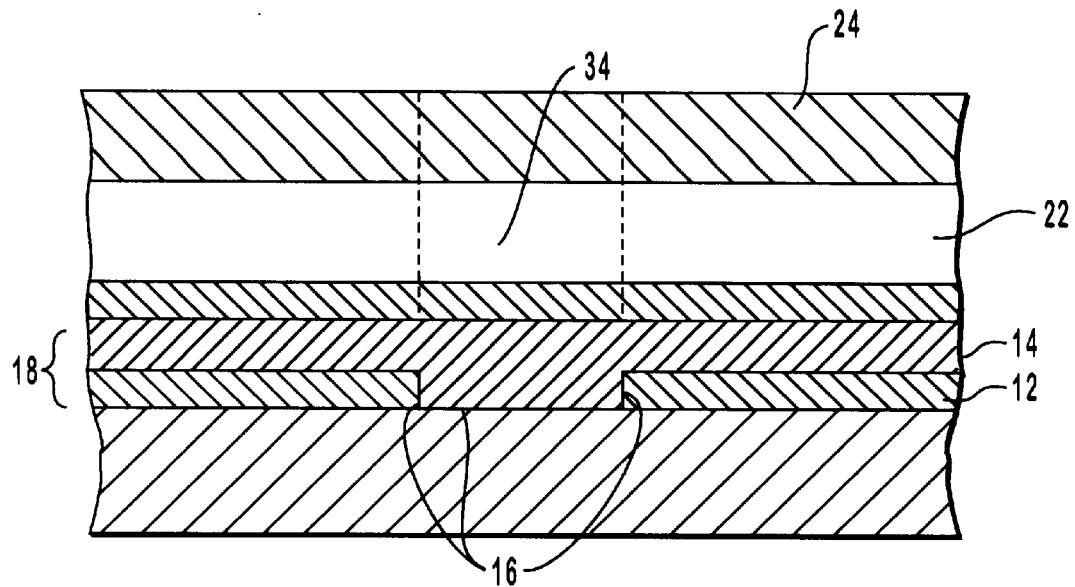
FIGS. 2A and 2B are cross-section elevation views of a multilayer structure subjected to a method for exposing a surface of a metal-containing layer involving the use of laser ablation and one photolithographic step.
Figure 2B:
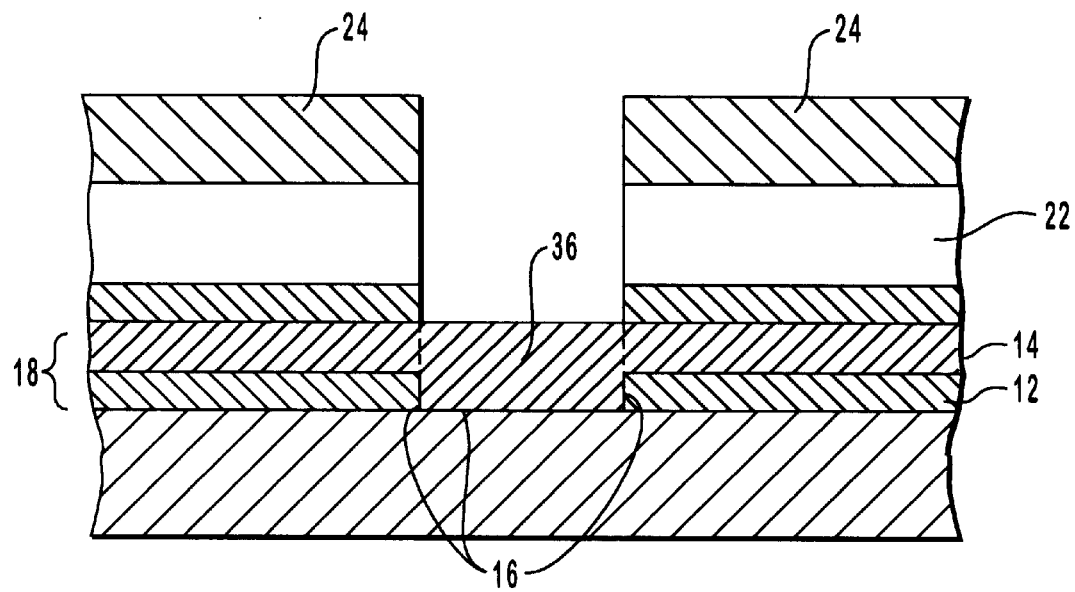

The inventive process described herein is directed to methods for exposing a surface of a metal-containing surface feature on a semiconductor wafer by laser ablation of layers that overlie the surface feature. FIGS. 3–9 illustrate a multilayer structure that is processed according to the invention. In the following detailed description and in the several figures of the drawings, like elements are identified with like reference numerals.

Figure 3:
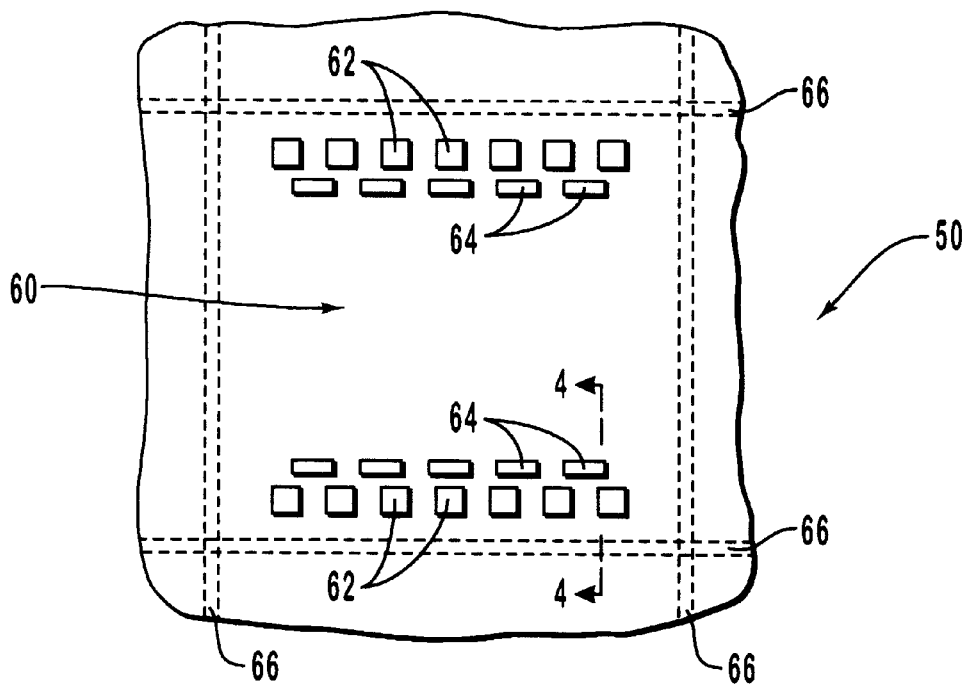
FIG. 3 is a partial top view of a semiconductor wafer containing multiple dies before packaging processes are conducted.

FIG. 3 is a top view of a portion of semiconductor wafer 50 having multiple dies, one of which is shown in detail at 60. Die 60 may have a plurality of metal-containing surface features such as bond pads 62 and fuse lines 64. Die 60 is substantially defined by a set of scribe lines 66 inscribed on semiconductor wafer 50. The arrangement of surface features of die 60 in FIG. 3 is presented for illustrative purposes. In practice, die 60 is any semiconductor structure formed by known methods in the art. Moreover, surface features of die 60 may be positioned in any suitable arrangement. For example, bond pads 62 may be located near the center of die 60 instead of at the periphery as shown in FIG.

3. The metal-containing surface features that are contemplated under this invention are not limited to bond pads 62 and fuse lines 64, but include any surface feature that may be exposed on a semiconductor wafer during or after packaging processing of die 60.

Figure 4:
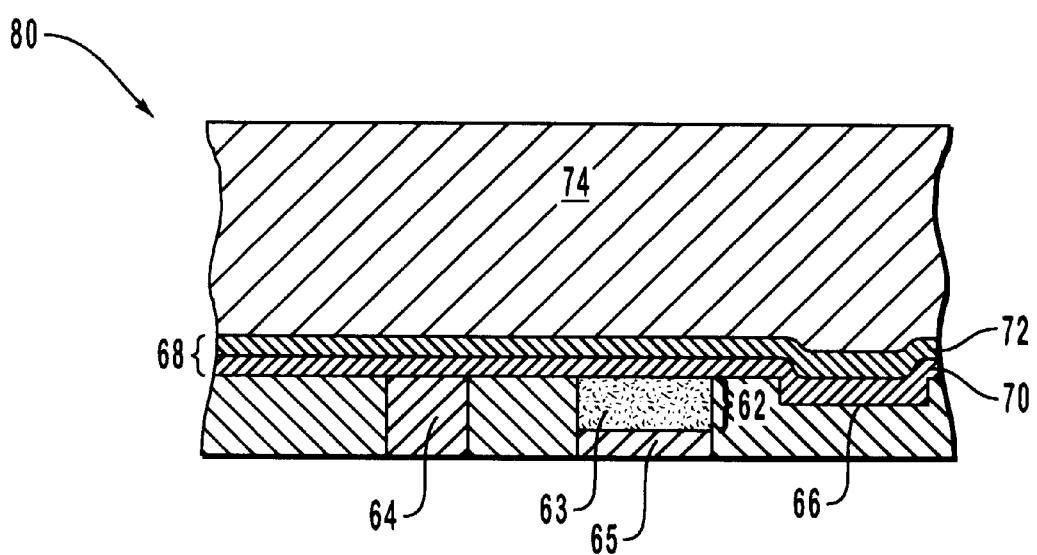
FIG. 4 is a partial cross-section elevation view of the semiconductor wafer of FIG. 3 taken along Section Line 4—4, illustrating a passivation layer and a stress buffer layer.

Bond pads 62 provide an interface between the internal circuitry of die 60 and the external environment. Bond pads 62 may comprise any electrically conductive material to which conductive wiring may be bonded. After die 60 is packaged, bond pads 62 must remain exposed or be re-exposed so that electrical communication may be established with die 60 by attaching wiring upon bond pads 62. As illustrated in FIG. 4, bond pads 62 preferably comprise diffusion barrier layer 63 that includes a refractory metal nitride, such as titanium nitride upon a metal-containing, underlying layer 65. Diffusion barrier layer 63 substantially prevents diffusion of material from underlying layer 65 into overlying layers and vice versa.

Fuse lines 64 comprise a metal surface layer. After die 60 is provided with electrical connection, the internal circuitry of die 60 is commonly tested. It is common to design the internal circuitry with some redundancy, so that in the case of an occasional short circuit or other circuit defect, die 60 may still perform satisfactorily. If testing of the internal circuitry reveals circuit defects, the defective circuit may be disabled by activating ("blowing") a corresponding fuse line.

Turning to FIG. 3, scribe streets 66 are inscribed with a saw or otherwise upon the surface of semiconductor wafer 50 along the boundaries of individual die 60 and other dies. Scribe streets 66 impart structural weakness upon desired locations of semiconductor wafer 50 so that the wafer may be later separated into individual dies.

Passivation layer 68 is formed upon die 60 by known means as shown in FIG. 4. Preferably, passivation layer 68 comprises silicon dioxide layer 70 and silicon nitride layer 72. Silicon dioxide layer 70 is formed upon die 60 to protect metal-containing surfaces, such as those in bond pad 62 and fuse line 64, from oxidation. Silicon nitride layer 72 is formed upon silicon dioxide layer 70 to further provide passivation of surfaces subject to oxidation. Passivation layer 68 prevents deterioration of metal-containing surfaces from scratching, handling, corrosion or other chemical processes during packaging. Passivation layer 68 also provides a barrier against moisture or other oxidizing agents that may remain or later come into contact with die 60 after packaging. Additionally, silicon dioxide layer 70 is positioned so as to remain in contact with fuse line 64 during repair. Residual portions of silicon dioxide layer 70 allow a vapor phase of the metal of fuse line 64 to be generated so that fuse line 64 may be blown. Passivation layer 68 preferably has a total thickness in a range from about 1.5 microns to about 2.0 microns.

Stress buffer 74 is formed by known means upon passivation layer 68 with a thickness that is preferably in a range from about 5 microns to about 100 microns. Stress buffer 74 is preferably composed of a polymeric material such as an organic polyimide material or benzocyclobutene. The polyimide material preferably has a modulus of elasticity that is lower than those of both of die 60 and any molding compound that will later be formed over stress buffer 74. Consequently, stress buffer 74 absorbs stress produced upon application of molding compound. Moreover, stress buffer 74 absorbs any deformation of die 60 due to thermal expansion or other environmental conditions sufficiently to substantially prevent corresponding stress and deformation of the molding compound. As stress buffer 74 absorbs deformation of adjacent materials, the possibility of cracking of passivation layer 68 or mechanical failure of any part of die 60 is significantly reduced from the possibility of failure that would otherwise exist in the absence of stress buffer layer 74.

Stress buffer 74 may be sufficiently thick to absorb alpha particles such that a die packaged according to the invention may be used in high-radiation environments, such as satellite and other space applications or near radioactive materials. Penetration of alpha particles into a semiconductor substrate is known to cause soft errors, wherein memory storage losses occur in a memory chip. A polyimide layer at least 25 microns thick is generally needed to effectively shield a semiconductor substrate from alpha particles.

Figure 5:
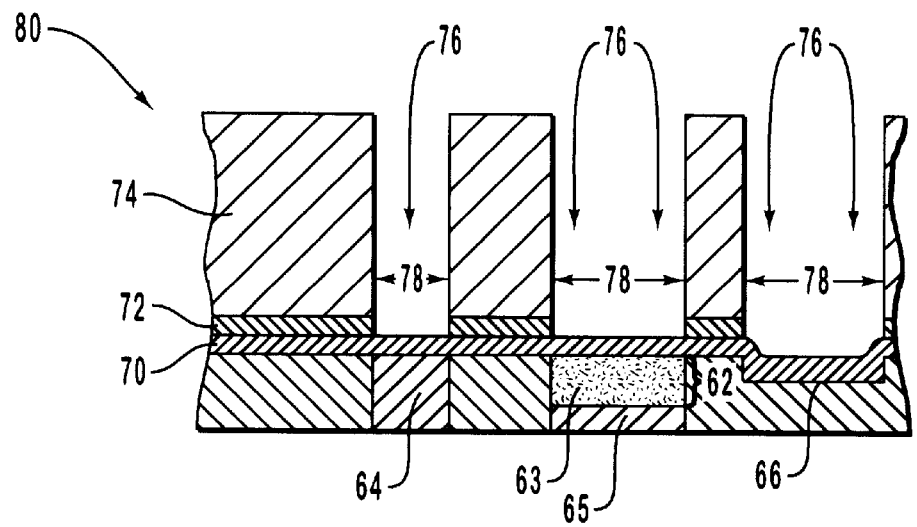
FIG. 5 is a partial cross-section elevation view of the semiconductor wafer of FIG. 4, further illustrating openings formed in the stress buffer layer and the passivation layer by laser ablation.

FIG. 5 shows the result of laser ablation of material from stress buffer 74 and silicon nitride layer 72. Radiation 76 emitted from a laser (not shown) is directed onto multilayer structure 80 in a specified pattern corresponding to surface features 62, 64 and 66 that are to be exposed. The specified pattern may be defined by selectively directing radiation 76 on specified regions of multilayer structure 80, by a photomask (not shown), or by other known means. Stress buffer 74 and silicon nitride layer 72 absorb radiation 76. The absorbed radiation is converted into thermal energy sufficient to cause ablation of polyimide and silicon nitride, thereby forming opening 78 extending through stress buffer 74 and silicon nitride layer 72. According to a preferred embodiment of the invention, ultraviolet light having a first wavelength in a range from about 193 nanometers to about 308 nanometers, and a power density in a range from about 0.1 J/cm$^2$ to about 6.0 J/cm$^2$ is used. However, any wavelength and associated power density are contemplated by the invention, provided that the wavelength is substantially absorbed by the polymeric material, such as polyimide, and by the silicon nitride, and that the power density is great enough to transmit thermal energy to multilayer structure 80 sufficiently to cause ablation of selected regions.

Figure 6:
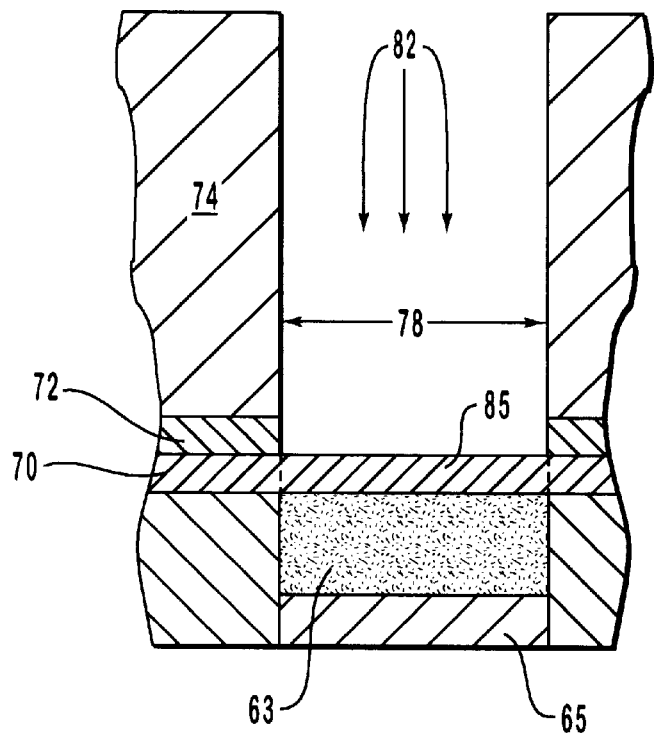
FIG. 6 is a partial cross-section elevation view of the semiconductor wafer of FIG. 5, showing further laser ablation whereby a surface of a metal-containing layer is exposed.

FIG. 6 is an enlarged view of a portion of multilayer structure 80 that includes bond pad 62, opening 78 and a surrounding area. Radiation 82 emitted from a laser is directed through opening 78 onto silicon dioxide layer 70. Radiation 82 has a wavelength to which silicon dioxide is substantially transparent. For example, silicon dioxide is substantially transparent to much of the ultraviolet spectrum, including the range from about 190 nanometers to about 1,500 nanometers. The transparency of silicon dioxide layer 70 allows most of radiation 82 to reach diffusion barrier 63. Radiation 82 is substantially absorbed by diffusion barrier 63, causing a portion thereof to be ablated. Material that is ablated from diffusion barrier 63 in turn causes removal of material from overlying region 85 of silicon dioxide layer 70 through thermal or physical processes. Radiation 82 should be applied continuously or in a series of pulses of a number and duration sufficient to remove silicon dioxide layer 70.

Figure 7:
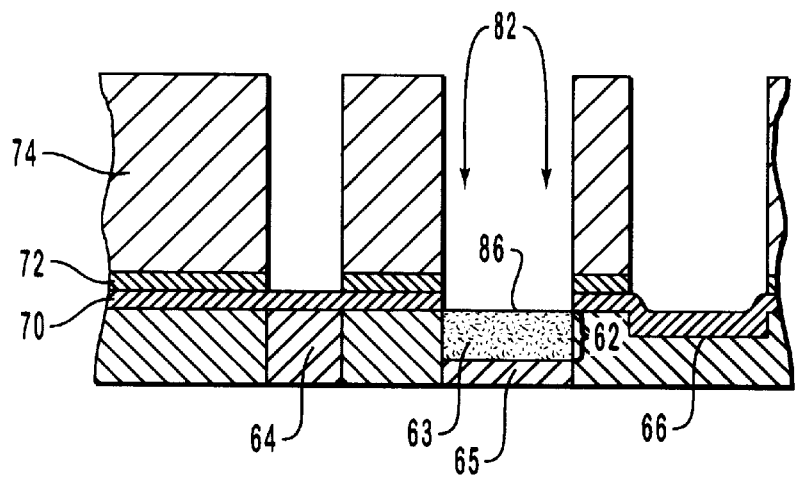
FIG. 7 is a partial cross-section elevation view of the semiconductor wafer of FIG. 6, illustrating the position of the exposed surface of the metal-containing layer.

As seen in FIG. 7, an exposed surface 86 is uncovered on bond pad 62. Preferably, exposed surface 86 is substantially planar so as to allow adequate bonding of wires with the bond pad. Most preferably, exposed surface 86 has a peak-to-peak roughness of not more than about 1%.

By way of example, exposed surface 86 can be laser ablated so as to have a peak-to-peak roughness of not more than about 1% by directing a series of 1 to 15 pulses of laser-generated electromagnetic radiation in a range from about 193 nanometers to about 308 nanometer onto the structure of FIG. 6. The radiation according to this example has an energy density in a range from about 0.1 J/cm² to about 6.0 J/cm². It will be understood that the duration and number of pulses that are needed are a function of the thickness of silicon dioxide layer 70 and the energy density applied.

Figure 8:
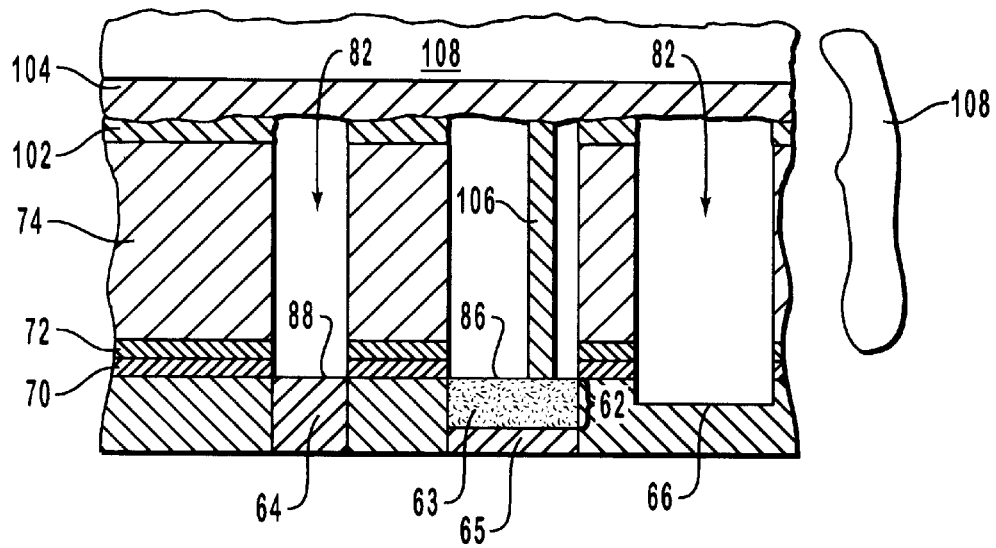
FIG. 8 is a partial cross-section elevation view of the semiconductor wafer of FIG. 7, showing additional surfaces exposed through laser ablation.

FIGS. 7 and 8 show that surfaces may be exposed on bond pad 62 and fuse line 64 in succession. Packaging processes may require exposure of surface 86 before fuse line 64 is to be exposed. In addition, it is preferable to leave intact the portion of silicon dioxide layer 70 positioned upon fuse line 64 until such time that fuse line 64 is blown to repair the internal circuitry of die 60. Ablation of material from selected regions of multilayer structure 80 is achieved, for example, by selectively directing radiation 82 first onto a region of silicon dioxide layer 70 overlying bond pad 62 and second onto a region of silicon dioxide layer 70 overlying fuse line 64. In FIG. 8, exposed surface 88 of fuse line 64 is formed in the same manner as exposed surface 86 is formed above in reference to FIG. 6. According to the present invention, openings may be formed in multilayer structure 80 to various depths, such as openings that stop on silicon nitride layer 72, silicon dioxide layer 70, or fuse line 64, by varying the location, intensity, duration, and wavelength of radiation exposure on multilayer structure 80.

In one application of the invention, exposed surface 86 of bond pad 62 may be formed in the same step by which opening 78 is formed. This is accomplished by directing radiation from a laser onto multilayer structure 80 without pause as material is ablated consecutively from stress buffer 74, silicon nitride layer 72 and diffusion barrier 63 with its accompanying removal of material from silicon dioxide layer 70. It will be appreciated that, in such case, the wavelength of radiation 76 is substantially equivalent to the wavelength of radiation 82.

The present invention optionally extends to at least one of several post-ablation steps. After ablation, division of semiconductor wafer 50 into individual dies 60 may be performed by exposing or sawing along scribe lines 66. A lead frame (not shown) may be attached directly upon stress buffer 74. A metal-containing lead frame is positioned upon stress buffer 74 as both the lead frame and stress buffer 74 are exposed to temperatures in a range from about 200° C. to about 400° C. This is sufficient to create a bond between the lead frame and stress buffer 74.

The present invention has application to a wide variety of methods for exposing surfaces of metal-containing layers by laser ablating material from multilayer structures other than those specifically described herein. For example, the invention as described herein may be practiced without formation of stress buffer 74 and without silicon nitride layer 72. In such an embodiment, radiation 82 is selectively directed through substantially transparent silicon dioxide layer 70 onto bond pad 62. Alternatively, the method of the invention may include one of stress buffer 74 and silicon nitride layer 72.

FIG. 8 shows further processing steps after exposed surface 86 of bond pad 62 is formed in which an electrical connection 106 is made between an external lead 104 and exposed surface 86. By way of example, external lead 104 can be integral to a lead frame that is directly upon stress buffer 74 and adhered thereto by an adhesive surface 102. Adhesive surface 102 and external lead 104 can then be exposed to a temperature sufficient to form an adhesive bond between stress buffer 74 and external lead 104. After attaching external lead 104 to stress buffer 74, testing of the circuitry of the device for defects can proceed, and blowing or activating a fuse such as fuse line 64 can be performed to take advantage of redundancy to remove the defects found. An encapsulating layer of molding compound 108, such as a polymeric molding compound, can be formed upon stress buffer 74.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A process for exposing a surface on a diffusion barrier layer, said process comprising:

providing a semiconductor substrate;

providing a diffusion barrier layer upon said semiconductor substrate;

providing a silicon dioxide layer upon said diffusion barrier layer, said silicon dioxide layer being substantially transparent to electromagnetic radiation having a selected wavelength; and laser ablating a portion of said diffusion barrier layer by directing electromagnetic radiation having said selected wavelength through said silicon dioxide layer, a region of said silicon dioxide layer that is positioned upon said portion of said diffusion barrier being removed, thereby exposing a substantially planar surface on said diffusion barrier layer.

2. A process as recited in claim 1, further comprising, prior to laser ablating said portion of said diffusion barrier layer:

forming a layer of organic material upon said silicon dioxide layer; and then laser ablating a portion of said layer of organic material with electromagnetic radiation having a second wavelength, thereby forming an opening through said layer of organic material terminating at said region of said silicon dioxide layer that is removed while laser ablating said portion of said diffusion barrier.

3. A process as recited in claim 2, wherein:

said electromagnetic radiation having said selected wavelength is selected so as to substantially pass through said silicon dioxide material and to be substantially absorbed by said diffusion barrier; and said electromagnetic radiation having said second wavelength is selected so as to be substantially absorbed by said organic material.

4. A process as recited in claim 3, wherein said selected wavelength is substantially equivalent to said second wavelength.

5. A process as recited in claim 2, wherein a thickness of said layer of organic material is in a range from about 5 microns to about 100 microns.

6. A process as recited in claim 1, wherein said selected wavelength is in a range from about 193 nanometers to about 308 nanometers.

7. A process as recited in claim 1, wherein said electromagnetic radiation having said selected wavelength has an energy density in a range from about 0.1 J/cm² to about 6.0 J/cm².

8. A process as recited in claim 1, further comprising, after providing said silicon dioxide layer, providing a silicon nitride layer upon said silicon dioxide layer.

9. A process as recited in claim 8, wherein said silicon dioxide layer and said silicon nitride layer have a combined thickness in a range from about 1.5 microns to about 2.0 microns.

10. A process as recited in claim 8, further comprising, after providing said silicon nitride layer, laser ablating a portion of said silicon nitride layer with electromagnetic radiation having a second wavelength, thereby forming an opening through said silicon nitride layer terminating at said region of said silicon dioxide layer that is removed while laser ablating said portion of said diffusion barrier.

11. A process as recited in claim 2, wherein said layer of organic material is substantially composed of a polyimide material.

12. A process as recited in claim 2, wherein said layer of organic material is substantially composed of benzocyclobutene.

13. A process as recited in claim 1, wherein said substantially planar surface of said diffusion barrier layer has a maximum peak-to-peak surface roughness less than about 1%.

14. A process as recited in claim 1, wherein providing said diffusion barrier layer upon said semiconductor substrate comprises forming said diffusion barrier layer upon an electrically conductive layer provided in said semiconductor substrate.

15. A process as recited in claim 14, wherein said diffusion barrier layer substantially prevents diffusion of material from said electrically conductive layer through said diffusion barrier.

16. A process as recited in claim 14, wherein said diffusion barrier layer is substantially composed of a refractory metal nitride.

17. A process as recited in claim 16, wherein said refractory metal nitride is titanium nitride.

18. A process as recited in claim 1, further comprising, after laser ablating a portion of said diffusion barrier layer, establishing an electrical connection between an external lead and said substantially planar surface of said diffusion barrier.

19. A process as recited in claim 2, further comprising, after laser ablating a portion of said diffusion barrier layer, attaching a lead frame directly upon said layer of organic material.

20. A process as recited in claim 19, wherein attaching said lead frame comprises:
   providing an adhesive surface on said layer of organic material;
   positioning said lead frame on said adhesive surface; and
   exposing both of said adhesive surface and said lead frame to a temperature sufficient to form an adhesive bond between said layer of organic material and said lead frame.

21. A process as recited in claim 19, further comprising, after attaching said lead frame to said layer of organic material, forming an encapsulating layer of molding compound upon said layer of organic material.

22. A process for exposing a surface of a metal-containing layer, said process comprising:
   providing a semiconductor substrate having a metal-containing layer;
   providing a silicon-containing layer upon said metal-containing layer, said silicon-containing layer containing at least one of silicon dioxide and silicon nitride, said silicon-containing layer being substantially transparent to electromagnetic radiation having a second wavelength;
   forming a polymeric layer over said silicon-containing layer;
   forming a first opening extending through said polymeric layer, said first opening having a bottom defined by said silicon-containing layer, said first opening being formed by directing electromagnetic radiation having a first wavelength onto said polymeric layer such that at least some of said electromagnetic radiation having said first wavelength is absorbed by said polymeric layer, thereby ablating a portion of said polymeric layer; and
   forming a second opening extending from said bottom of said first opening through said silicon-containing layer, said second opening being formed by directing electromagnetic radiation having a second wavelength through said first opening and substantially through said silicon-containing layer onto said metal-containing layer, at least some of said electromagnetic radiation having said second wavelength being absorbed by said metal-containing layer such that a portion of said metal-containing layer is ablated, thereby removing a region of said silicon-containing layer positioned upon said metal-containing layer so as to expose said surface of said metal-containing layer.

23. A process as recited in claim 22, wherein said first wavelength is substantially equivalent to said second wavelength.

24. A process as recited in claim 22, wherein said surface of said metal-containing layer is substantially planar.

25. A process as recited in claim 24, wherein said substantially planar surface of said metal-containing layer has a maximum peak-to-peak surface roughness less than about 1%.

26. A process for exposing a surface of a refractory metal nitride layer, said process comprising:
   providing a multilayer structure having:
      a semiconductor substrate;
      a refractory metal nitride layer formed upon said semiconductor substrate;
      a silicon dioxide layer formed upon said refractory metal nitride layer;
      a silicon nitride layer formed upon said silicon dioxide layer;
      a polyimide layer formed over said silicon nitride layer;
   forming an opening into said multilayer structure by directing electromagnetic radiation emitted from a laser onto said multilayer structure such that material is successively ablated from said polyimide layer and said silicon nitride layer, said opening having a bottom defined by a surface on said silicon dioxide layer; and
   directing said electromagnetic radiation through said opening and substantially through said silicon dioxide layer, said silicon dioxide layer being substantially transparent to said electromagnetic radiation, most of said electromagnetic radiation reaching and being absorbed by a portion of said refractory metal nitride layer such that said portion of said refractory metal nitride layer is ablated, a region of said silicon dioxide layer that is positioned substantially upon said refractory metal nitride layer being removed, thereby exposing a surface of said refractory metal nitride layer.

27. A process as recited in claim 26, wherein said surface of said refractory metal nitride layer has a maximum peak-to-peak surface roughness less than about 1%.

28. A process for forming a first opening and a second opening in a multilayer structure, said process comprising:

providing a multilayer structure having:
- a semiconductor substrate;
- a first surface feature on said semiconductor substrate, said first surface feature having a metal-containing layer;
- a second surface feature on said semiconductor substrate, said second surface feature having a metal-containing layer;
- a silicon dioxide layer upon both of said first surface feature and said second surface feature, said silicon dioxide layer having a first region positioned upon said first surface feature and having a second region positioned upon said second surface feature; and
- a silicon nitride layer formed upon said silicon dioxide layer, said silicon nitride layer having a first region positioned upon said first region of said silicon dioxide layer, said silicon nitride layer further having a second region positioned upon said second region of said silicon dioxide layer;

directing electromagnetic radiation emitted from a laser onto said first region of said silicon nitride layer such that said first region of said silicon nitride layer is ablated, thereby forming a first opening in said multilayer structure having a bottom defined by said silicon dioxide layer; and directing electromagnetic radiation emitted from laser onto said second region of said silicon nitride layer such that said second region of said silicon nitride layer is ablated, said electromagnetic radiation reaching and substantially passing through said second region of said silicon dioxide layer, said electromagnetic radiation further reaching said second surface feature, a portion of said second surface feature being ablated, thereby removing said second region of said silicon dioxide layer so as to form a second opening in said multilayer structure.

29. A process as recited in claim 28, wherein said electromagnetic radiation reaching and ablating said second surface feature forms a surface thereon having a maximum peak-to-peak surface roughness less than about 1%.

30. A process for packaging a semiconductor substrate, said process comprising:
- providing a semiconductor substrate having a metal-containing bond pad;
- forming a passivation layer upon said metal-containing bond pad;
- directing electromagnetic radiation from a laser through said passivation layer onto said metal-containing bond pad, said passivation layer being substantially transparent to said electromagnetic radiation, a portion of said metal-containing bond pad being ablated, thereby removing a portion of said passivation layer that is positioned upon said metal-containing bond pad so as to expose said metal-containing bond pad;
- positioning a lead frame near said semiconductor substrate, said lead frame having an external electrical lead, said lead frame being electrically isolated from said semiconductor substrate with a dielectric material; and
- attaching wiring between said metal-containing bond pad and said external electrical lead.

31. A process as recited in claim 30, wherein said exposed metal-containing bond pad has a surface thereon having a maximum peak-to-peak surface roughness less than about 1% to which said wiring between said metal-containing bond pad and said external electrical lead is attached.

32. A process for packaging a semiconductor substrate, said process comprising:
- providing a semiconductor substrate having both a bond pad that contains metal and a fuse line that contains metal;
- providing a silicon dioxide layer upon both of said bond pad and said fuse line, said silicon dioxide layer being substantially transparent to electromagnetic radiation having a selected wavelength, said silicon dioxide layer having a first portion positioned upon said fuse line and having a second portion positioned upon said bond pad;
- providing a silicon nitride layer upon said silicon dioxide layer, said silicon nitride layer having a first portion positioned upon said first portion of said silicon dioxide layer, said silicon nitride layer further having a second portion positioned upon said second portion of said silicon dioxide layer;
- laser ablating said first portion of said silicon nitride layer, thereby exposing said first portion of said silicon dioxide layer;
- laser ablating said second portion of said silicon nitride layer, thereby exposing said second portion of said silicon dioxide layer; and
- laser ablating a portion of said metal-containing bond pad using electromagnetic radiation having said selected wavelength, thereby removing said second portion of said silicon dioxide layer.

33. A process as recited in claim 32, wherein laser ablating said a portion of said metal-containing bond pad forms a surface thereon having a maximum peak-to-peak surface roughness less than about 1%.

34. A process for providing stress buffering for a semiconductor substrate, said process comprising:
- providing a semiconductor substrate having a metal-containing surface feature;
- providing a silicon dioxide layer formed upon said semiconductor substrate, said silicon dioxide layer being substantially transparent to electromagnetic radiation having a selected wavelength;
- forming a polyimide layer upon said silicon dioxide layer, said polyimide layer having a thickness in a range from about 5 microns to about 100 microns;
- directing electromagnetic radiation emitted from a laser onto said polyimide layer such that a portion of said polyimide layer is ablated, thereby forming an opening in said polyimide layer;
- emitting from a laser electromagnetic radiation having said selected wavelength, said electromagnetic radiation being directed through said opening and substantially through said silicon dioxide layer onto said metal-containing surface feature such a portion of said metal-containing surface feature is ablated, a region of said silicon dioxide layer positioned upon said metal-containing surface feature being removed, whereby said metal-containing surface feature is exposed; and
- encapsulating both of said semiconductor substrate and said polyimide layer with a polymeric molding compound, said polyimide layer providing stress buffering for said semiconductor substrate.

35. A process as recited in claim 34, wherein said metal-containing surface feature ablated and exposed by said laser electromagnetic radiation has a surface thereon having a maximum peak-to-peak surface roughness less than about 1%.

36. A process for packaging a semiconductor substrate, said process comprising:

providing a semiconductor substrate having a metal-containing bond pad;

providing a passivation layer upon said semiconductor substrate, said passivation layer being substantially transparent to electromagnetic radiation having a selected wavelength;

forming, upon said passivation layer, a polyimide layer having an exposed surface;

emitting from a laser electromagnetic radiation having said selected wavelength, said electromagnetic radiation being directed onto said polyimide layer such that a portion of said polyimide layer is ablated, said electromagnetic radiation further being directed through said passivation layer onto said metal-containing bond pad such that a portion of said metal-containing bond pad is ablated, a region of said passivation layer upon said metal-containing bond pad being removed, whereby an opening is formed that extends through said polyimide layer and said passivation layer; and attaching a lead frame directly to said exposed surface of said polyimide layer.

37. A process as recited in claim 36, wherein said metal-containing bond pad ablated and exposed by said laser electromagnetic radiation has a surface thereon having a maximum peak-to-peak surface roughness less than about 1%.

38. A process for forming a plurality of openings in a multilayer structure, said process comprising:

providing said multilayer structure containing:
  a semiconductor substrate having a metal-containing surface feature;
  a silicon dioxide layer upon said metal-containing surface feature, said silicon dioxide layer being substantially transparent to electromagnetic radiation having a selected wavelength;
  a silicon nitride layer upon said silicon dioxide layer; and
  a polyimide layer upon said silicon nitride layer;

laser ablating a first portion of said polyimide layer, thereby forming a first opening having a bottom defined by said silicon nitride layer;

laser ablating successively a second portion of said polyimide layer and a first portion of said silicon nitride layer positioned under said second portion of said polyimide layer, thereby forming a second opening having a bottom defined by said silicon nitride layer;

laser ablating successively a third portion of said polyimide layer and a second portion of said silicon nitride layer positioned under said third portion of said polyimide layer, thereby forming a third opening having a bottom defined by said silicon nitride layer; and extending said third opening to said metal-containing surface feature by directing said electromagnetic radiation having said selected wavelength through said third opening, said electromagnetic radiation substantially reaching said metal-containing surface feature such that a portion of said metal-containing surface feature is ablated, whereby a portion of said silicon dioxide layer that is upon said metal-containing surface feature is removed.

39. A process as recited in claim 38, wherein said metal-containing surface feature ablated and exposed by said electromagnetic radiation has a surface thereon having a maximum peak-to-peak surface roughness less than about 1%.

40. A process for packaging a semiconductor substrate, said process comprising:

providing a semiconductor substrate having internal circuitry, a bond pad, and a fuse line, each of the bond pad and the fuse line containing metal;

providing a silicon dioxide layer upon both of said bond pad and said fuse line, said silicon dioxide layer being substantially transparent to electromagnetic radiation having a selected wavelength, said silicon dioxide layer having a first portion positioned upon said bond pad and having a second portion positioned upon said fuse line;

providing a silicon nitride layer upon said silicon dioxide layer, said silicon nitride layer having a first portion positioned upon said first portion of said silicon dioxide layer, said silicon nitride layer further having a second portion positioned upon said second portion of said silicon dioxide layer;

forming a polyimide layer upon said silicon nitride layer, said polyimide layer having a first portion positioned upon said first portion of said silicon nitride layer, said polyimide layer further having a second portion positioned upon said second portion of said silicon nitride layer;

exposing said bond pad, including:
  laser ablating said first portion of said polyimide layer;
  laser ablating said first portion of said silicon nitride layer; and
  laser ablating a portion of said bond pad using electromagnetic radiation having said selected wavelength, said first portion of said silicon dioxide layer thereby being removed;

exposing said second portion of said silicon dioxide layer, including:
  laser ablating said second portion of said polyimide layer; and
  laser ablating said second portion of said silicon nitride layer;

attaching a lead frame directly to said polyimide layer, said lead frame having an external lead;

attaching wiring between said bond pad and said external electrical lead;

testing said internal circuitry for a defective circuit;

disabling said defective circuit by activating said fuse line; and encapsulating both of said semiconductor substrate and said polyimide layer with a polymeric molding compound.

41. A process as recited in claim 40, wherein laser ablating said portion of said bond pad forms a surface thereon having a maximum peak-to-peak surface roughness less than about 1%.

42. A process as recited in claim 40, wherein said polyimide layer has a modulus of elasticity that is lower than that of said polymeric molding compound.

* * * * *

UNITED STATES PATENT AND TRADEMARK OFFICE
CERTIFICATE OF CORRECTION

PATENT NO. : 5,932,485
DATED : Aug. 3, 1999
INVENTOR(S) : Kevin H. Schofield

It is certified that error appears in the above-identified patent and that said Letters Patent is hereby corrected as shown below:

Col. 1, line 55, after "such" insert --as--

Col. 2, line 38, after "through" change "pattered" to --patterned--

Col. 5, line 61, after "both" delete "of"

Signed and Sealed this

Eighth Day of August, 2000

Attest:

Q. TODD DICKINSON

*Attesting Officer*    *Director of Patents and Trademarks*